(12) United States Patent
Molnar et al.

(10) Patent No.: US 6,766,158 B1
(45) Date of Patent: Jul. 20, 2004

(54) HARMONIC CANCELLATION MIXER

(75) Inventors: Alyosha C. Molnar, Costa Mesa, CA (US); Rahul Magoon, Irvine, CA (US); Keith J. Rampmeier, Costa Mesa, CA (US)

(73) Assignee: Skyworks Solutions, Inc., Newport Beach, CA (US)

( * ) Notice: Subject to any disclaimer, the term of this patent is extended or adjusted under 35 U.S.C. 154(b) by 577 days.

(21) Appl. No.: 09/823,314

(22) Filed: Mar. 30, 2001

(51) Int. Cl.$^7$ ................................................. H04B 1/26
(52) U.S. Cl. ...................... 455/323; 455/136; 455/147; 331/46
(58) Field of Search ............................ 455/323, 76, 78, 455/88, 208, 552.1, 553.1, 131, 136, 322, 324, 266, 234.1, 73, 326, 112, 130, 147; 331/2, 46, 48; 342/368

(56) References Cited

U.S. PATENT DOCUMENTS

| | | | |
|---|---|---|---|
| 4,204,264 A | 5/1980 | Lipman | ........................ 363/71 |
| 4,531,098 A | 7/1985 | Reed | ............................ 330/53 |
| 4,560,945 A | 12/1985 | Olver | ......................... 330/149 |
| 5,206,539 A | 4/1993 | Kammeter | ................... 307/105 |
| 5,327,332 A * | 7/1994 | Hafemeister | ................ 362/392 |
| 5,339,184 A * | 8/1994 | Tang | ........................... 398/116 |
| 5,343,080 A | 8/1994 | Kammeter | ................... 307/105 |
| 5,434,455 A | 7/1995 | Kammeter | ................... 307/105 |
| 5,589,797 A * | 12/1996 | Gans et al. | ................. 330/149 |
| 5,859,611 A * | 1/1999 | Lam et al. | ................... 342/368 |
| 6,694,129 B2 * | 2/2004 | Peterzell et al. | .............. 455/76 |

* cited by examiner

Primary Examiner—Tony T. Nguyen
(74) Attorney, Agent, or Firm—Thomas, Kayden, Horstemeyer & Risley

(57) ABSTRACT

A mixing system divides a local oscillator ("LO") signal into two signals having a predetermined phase difference, mixes each of the two signal with an input signal to produce a mixed signal, and then combines the mixed signals to produce an output signal having substantially no third-order mixing products.

74 Claims, 9 Drawing Sheets

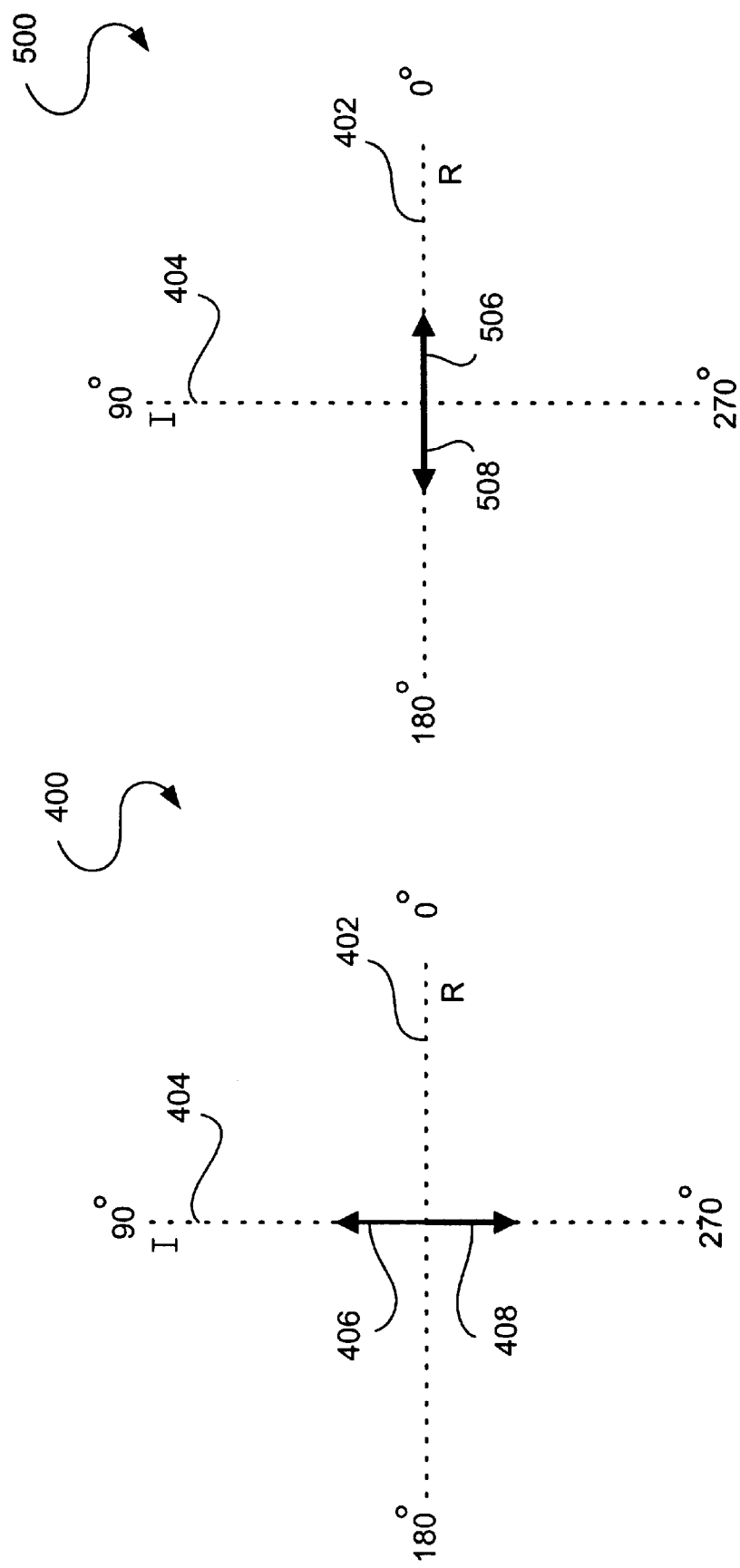

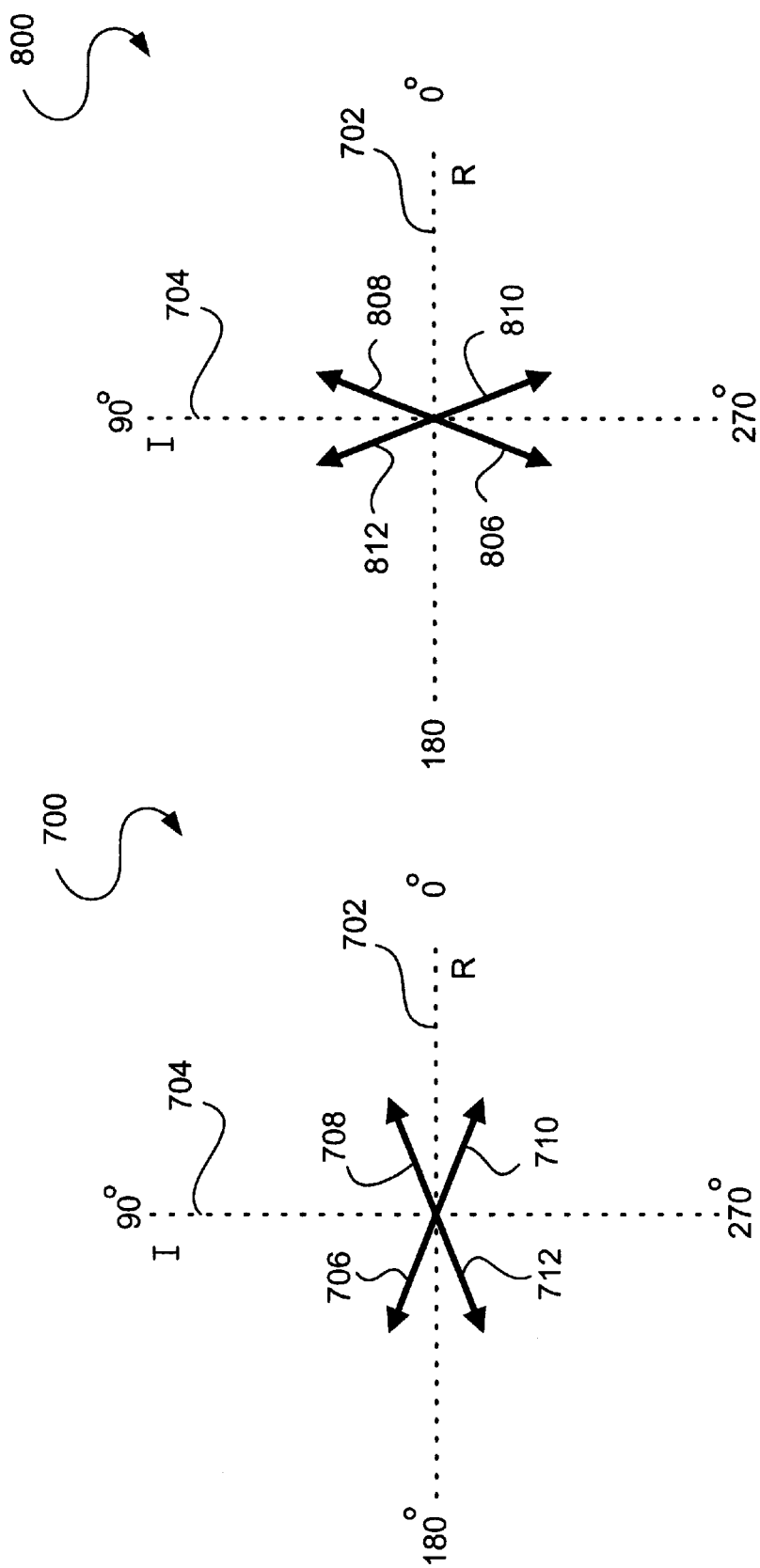

HARMONIC CANCELLATION MIXER

BACKGROUND OF THE INVENTION

1. Field of the Invention.

This invention relates to wireless transmitters and receivers and, more particularly, to frequency mixers.

2. Related Art.

A key principle of a frequency mixer is that, in mixing multiple voltage signals together, it adds and subtracts their frequencies to produce new frequencies. In the field of signal processing, the process of multiplication in the time domain is recognized as equivalent to the process of convolution in the frequency domain. Mixers produce distortion or multiplication products that reduce or diminish the quality of the output signal. Much of the art and science of making good use of multiplication in mixing goes into minimizing these unwanted multiplication products (or their effects) and making multipliers provide their frequency translations as efficiently as possible.

Mixers also create nonlinear distortion. Nonlinear distortion may take the form of harmonic distortion, in which integer multiples of input frequencies occur, or intermodulation distortion (IMD), in which different components multiply to form new components. Any departure from absolute linearity results in some form of nonlinear distortion.

Standard mixer design involves significantly nonlinear multiplication. Typically, the switching operation of the mixer causes the local oscillator signal ("LO") to act effectively as a square wave. There are several advantages to such switching action, including reduced noise, improved gain, insensitivity to device mismatch and variation, insensitivity to exact LO strength, and simplified design. A disadvantage, however, is that odd-order mixing products ("OMPs") are generated. An OMP is defined as the product of one input and an odd harmonic of another input.

In many situations only one of the frequency components, such as, for example, $f_{input} - f_{lo}$ or $f_{lo} - f_{input}$, is of interest and all other products are removed through filtering or image rejection. This approach works well if all of the frequency products to be suppressed by filtering are sufficiently far from the desired frequency. Problems can arise, however, if there is an unwanted signal present on the input that has a frequency that is approximately equal to the frequency of the input signal plus twice the LO frequency ($f_{unwanted} \approx 2*f_{lo} + f_{input}$). An unwanted signal with such a frequency can cause interference between the output signal and a third-order mixing term corresponding to the unwanted signal because the frequency of the third-order mixing term may be very close to the frequency of the output signal ($f_{unwanted} - 3*f_{lo} \approx f_{input} - f_{lo}$)

In certain applications, an OMP can drastically impair performance. One application where OMPs are especially problematic is in modulators inserted within phase-locked-loops such as, for example, translational loops typically found in Global System for Mobile Communications (GSM) transmitters. In such applications, the use of a phase detector results in modulated harmonics falling close to the intended signal and generating out-of band spurious emissions. A second application where OMPs can cause problems is within a near-zero intermediate frequency (IF) receiver. In such receivers, odd harmonics corresponding to an LO can result in signal interference. What is needed then is a system for preventing odd-order mixing products from significantly degrading the quality of a frequency mixer output.

SUMMARY

In one embodiment of the invention, a low harmonics mixing system produces a mixer output having significantly fewer odd-order mixing products than a standard mixer. More specifically, third-order mixing products caused by the presence of LO third harmonics can be substantially eliminated by dividing an LO signal into two separate signals having a predetermined phase difference, mixing each of the two signals with an input signal to produce a mixed signal, and then combining the mixed signals.

In another embodiment of the invention, an LO signal is first divided into two signals having a first predetermined phase difference. Each of the two signals is further divided into two mixing signals having a second predetermined phase difference and each of the mixing signals is mixed with an input signal to produce a mixed signal. Then, the mixed signals are combined to produce a mixer output having substantially no third-order, fifth-order, or ninth-order mixing products.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis instead being placed upon illustrating the principles of the invention. In the figures, like reference numerals designate corresponding parts throughout the different views.

FIG. 4 is a phase diagram illustrating an example of third harmonics cancellation by the low harmonics mixing system shown in FIG. 2.

FIG. 5 is a phase diagram illustrating another example of third harmonics cancellation by the low harmonics mixing system shown in FIG. 2.

FIG. 7 is a phase diagram illustrating an example of cancellation of third harmonics by the low harmonics mixing system shown in FIG. 6.

FIG. 8 is a phase diagram illustrating an example of cancellation of fifth harmonics by the low harmonics mixing system shown in FIG. 6.

DETAILED DESCRIPTION

Figure 1:
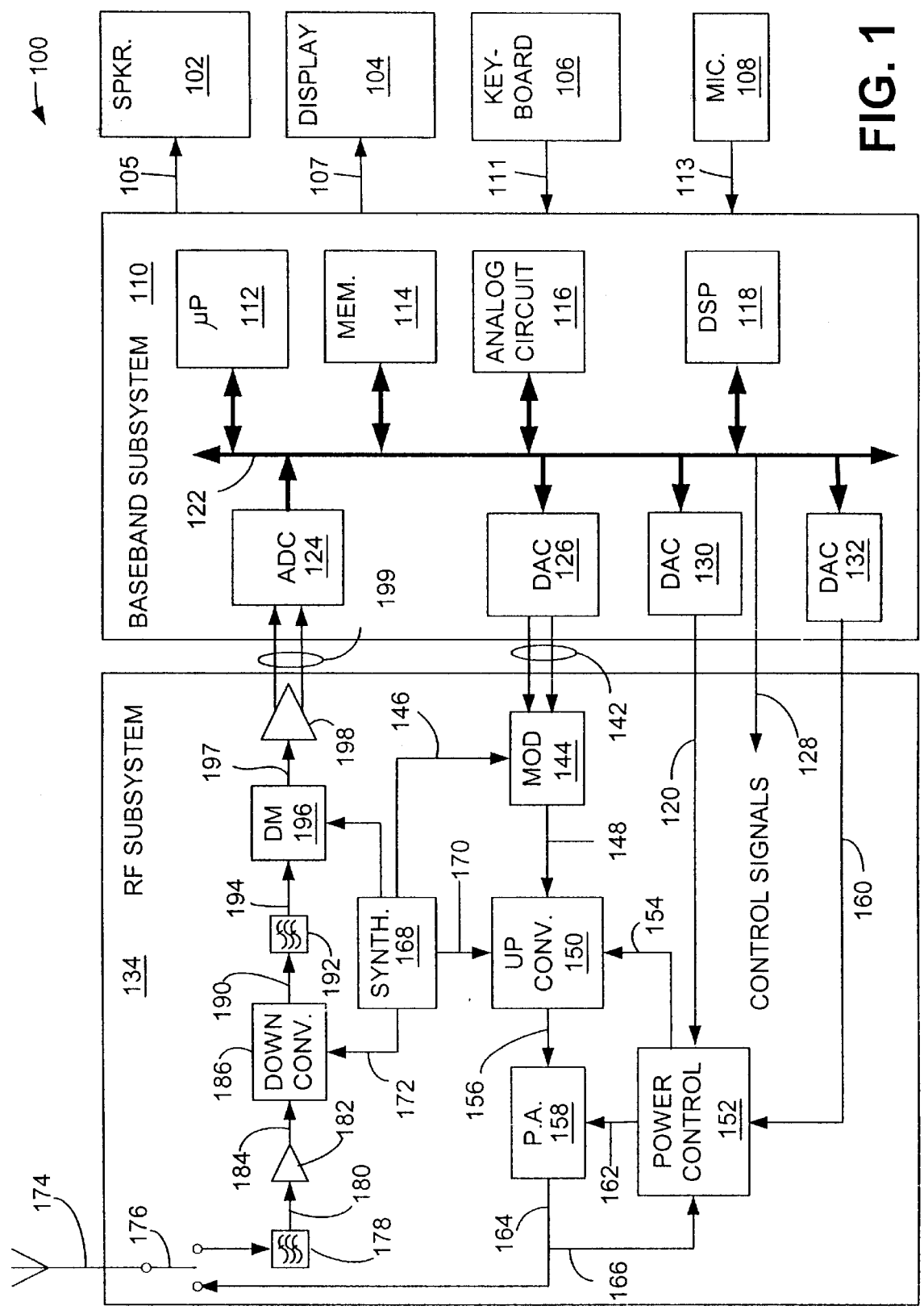
FIG. 1 is a block diagram illustrating a simplified portable transceiver.

FIG. 1 is a block diagram illustrating a non-limiting example of a simplified portable transceiver 100 in which an embodiment of this invention may be implemented. Portable transceiver 100 includes speaker 102, display 104, keyboard 106, and microphone 108, all connected to baseband subsystem 110. In a particular embodiment, portable transceiver 100 can be, for example, but not limited to, a portable telecommunication handset such as a mobile cellular-type telephone. Speaker 102 and display 104 receive signals from baseband subsystem 110 via connections 105 and 107, respectively. Similarly, keyboard 106 and microphone 108 supply signals to baseband subsystem 110 via connections 11I and 113, respectively. Baseband subsystem 110 includes microprocessor (μP) 112, memory 114, analog circuitry 116, and digital signal processor (DSP) 118, each coupled to a data bus 122. Examples of commercially available processors include, but are not limited to, an ARM processor such as an ARM 7 or ARM 9 processor, a ZSP Core supplied by LSI Logic or a Teak processor supplied by DSP Group. Data bus 122, although shown as a single bus, may be implemented using multiple busses connected as necessary among the subsystems within baseband subsystem 110. Microprocessor 112 and memory 114 provide signal timing, processing and storage functions for portable transceiver 100. Analog circuitry 116 provides the analog processing functions for the signals within baseband subsystem 110. Baseband subsystem 110 provides control signals to radio frequency (RF) subsystem 134 via connection 128. Although shown as a single connection 128, the control signals may originate from DSP 118 or from microprocessor 112, and may be supplied to a variety of points within RF subsystem 134. It should be noted that, for simplicity, only selected components of a portable transceiver 100 are illustrated in FIG. 1.

Baseband subsystem 110 also includes analog-to-digital converter (ADC) 124 and digital-to-analog converters (DACs) 126, 130 and 132. ADC 124, DAC 126 DAC 130 and DAC 132 communicate with microprocessor 112, memory 114, analog circuitry 116 and DSP 118 via data bus 122. DAC 126 converts digital communication information within baseband subsystem 110 into an analog signal for transmission to RF subsystem 134 via connection 142. In accordance with an aspect of the invention, DAC 130 provides a reference voltage power level signal to power control element 152 via connection 120 and DAC 132 provides an amplitude modulated (AM) signal to power control element 152 via connection 160. Alternatively, circuitry (not shown) could be placed in power control element 152 to derive the AM signal based on the output of DAC 126 received via connection 142. Connection 142, while shown as two directed arrows, includes the information that is to be transmitted by RF subsystem 134 after conversion from the digital domain to the analog domain.

RF subsystem 134 includes modulator 144, which, after receiving an LO signal from synthesizer 168 via connection 146, modulates the received analog information and provides a modulated signal via connection 148 to upconverter 150. Upconverter 150 also receives a frequency reference signal from synthesizer 168 via connection 170. Synthesizer 168 determines the appropriate frequency to which upconverter 150 will upconvert the modulated signal on connection 148.

Upconverter 150 supplies a phase-modulated signal via connection 156 to power amplifier 158. Power amplifier 158 amplifies the modulated signal on connection 156 to the appropriate power level for transmission via connection 164 to antenna 174. Illustratively, switch 176 controls whether the amplified signal on connection 164 is transferred to antenna 174 or whether a received signal from antenna 174 is supplied to filter 178. The operation of switch 176 is controlled by a control signal from baseband subsystem 110 via connection 128. Alternatively, the switch 176 may be replaced with circuitry to enable the simultaneous transmission and reception of signals to and from antenna 174.

A portion of the amplified transmit signal energy on connection 164 is supplied via connection 166 to power control element 152. Power control element 152, forms a closed power control feedback loop and supplies an AM component of the transmit signal via connection 162 to power amplifier 158 and also supplies a power control feedback signal via connection 154 to upconverter 150.

A signal received by antenna 174 will, at the appropriate time determined by baseband system 110, be directed via switch 176 to a receive filter 178. Receive filter 178 filters the received signal and supplies the filtered signal on connection 180 to low noise amplifier (LNA) 182. Receive filter 178 is a bandpass filter, which passes all channels of the particular cellular system in which the portable transceiver 100 is operating. As an example, for a GSM 900 MHz system, receive filter 178 would pass all frequencies from 935.1 MHz to 959.9 MHz, covering all 124 contiguous channels of 200 kHz each. The purpose of this filter is to reject all frequencies outside the desired region. LNA 182 amplifies the weak signal on connection 180 to a level at which downconverter 186 can translate the signal from the transmitted frequency back to a baseband frequency. Alternatively, the functionality of LNA 182 and downconverter 186 can be accomplished using other elements, such as for example but not limited to, a low noise block downconverter (LNB).

Downconverter 186 receives an LO signal from synthesizer 168, via connection 172. The LO signal is used in the downconverter 186 to downconvert the signal received from LNA 182 via connection 184. The downconverted frequency is called the intermediate frequency ("IF"). Downconverter 186 sends the downconverted signal via connection 190 to channel filter 192, also called the "IF filter." Channel filter 192 filters the downconverted signal and supplies it via connection 194 to demodulator 196. The channel filter 192 selects one desired channel and rejects all others. Using the GSM system as an example, only one of the 124 contiguous channels would be selected by channel filter 192. The synthesizer 168, by controlling the local oscillator frequency supplied on connection 172 to downconverter 186, determines the selected channel. Demodulator 196 recovers the transmitted analog information and supplies a signal representing this information via connection 197 to amplifier 198. Amplifier 198 amplifies the signal received via connection 197 and supplies an amplified signal via connection 199 to ADC 124. ADC 124 converts these analog signals to a digital signal at baseband frequency and transfers it via data bus 122 to DSP 118 for further processing. Although, for illustration purposes, this invention is described below with respect to portable transceiver 100, it should be noted that this invention may also be implemented in any wireless communication system that uses one or more mixers.

Figure 2:
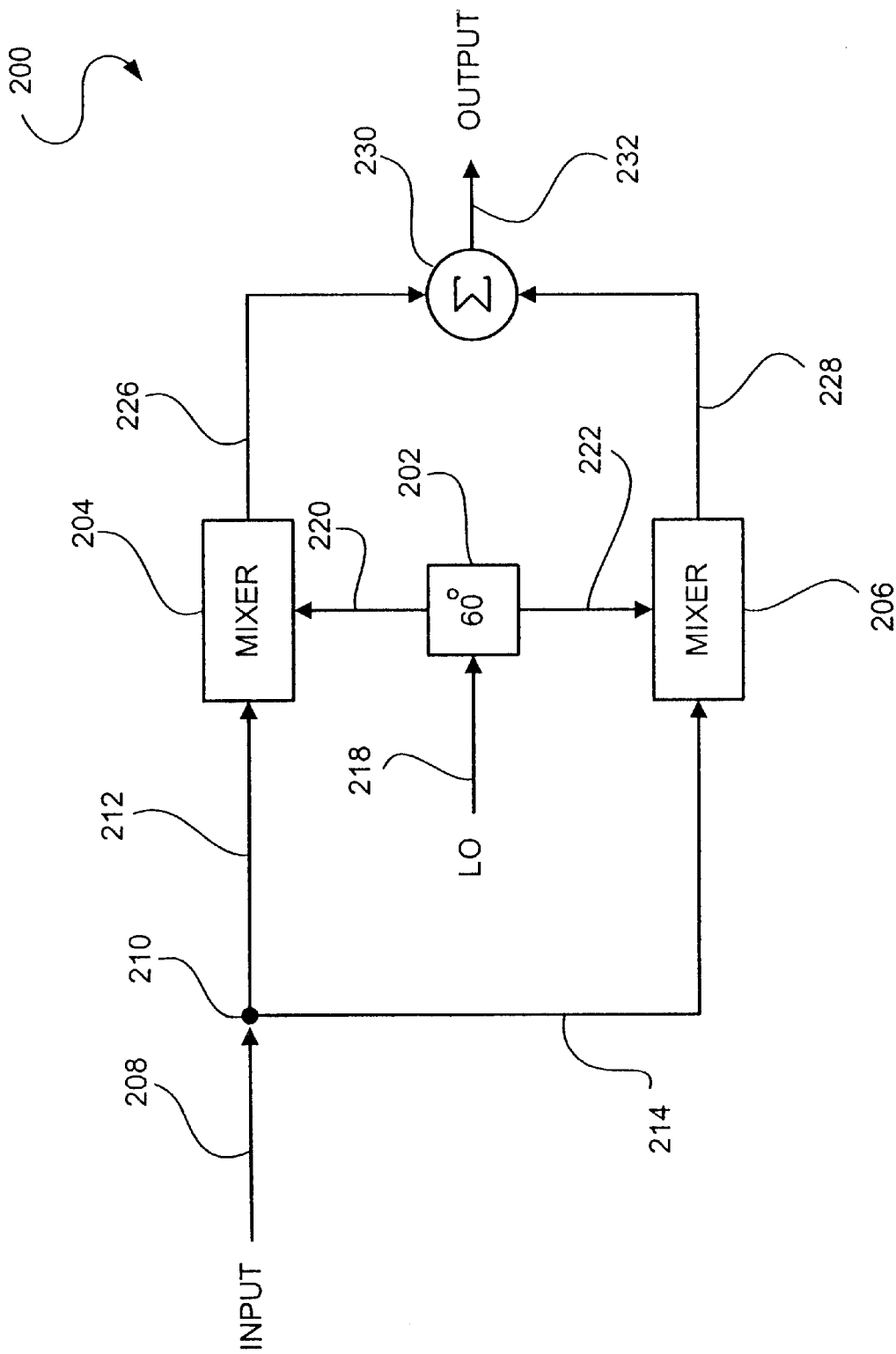
FIG. 2 is a block diagram illustrating an embodiment of a low harmonics mixing system contained in the portable transceiver illustrated in FIG. 1.
Figure 3:
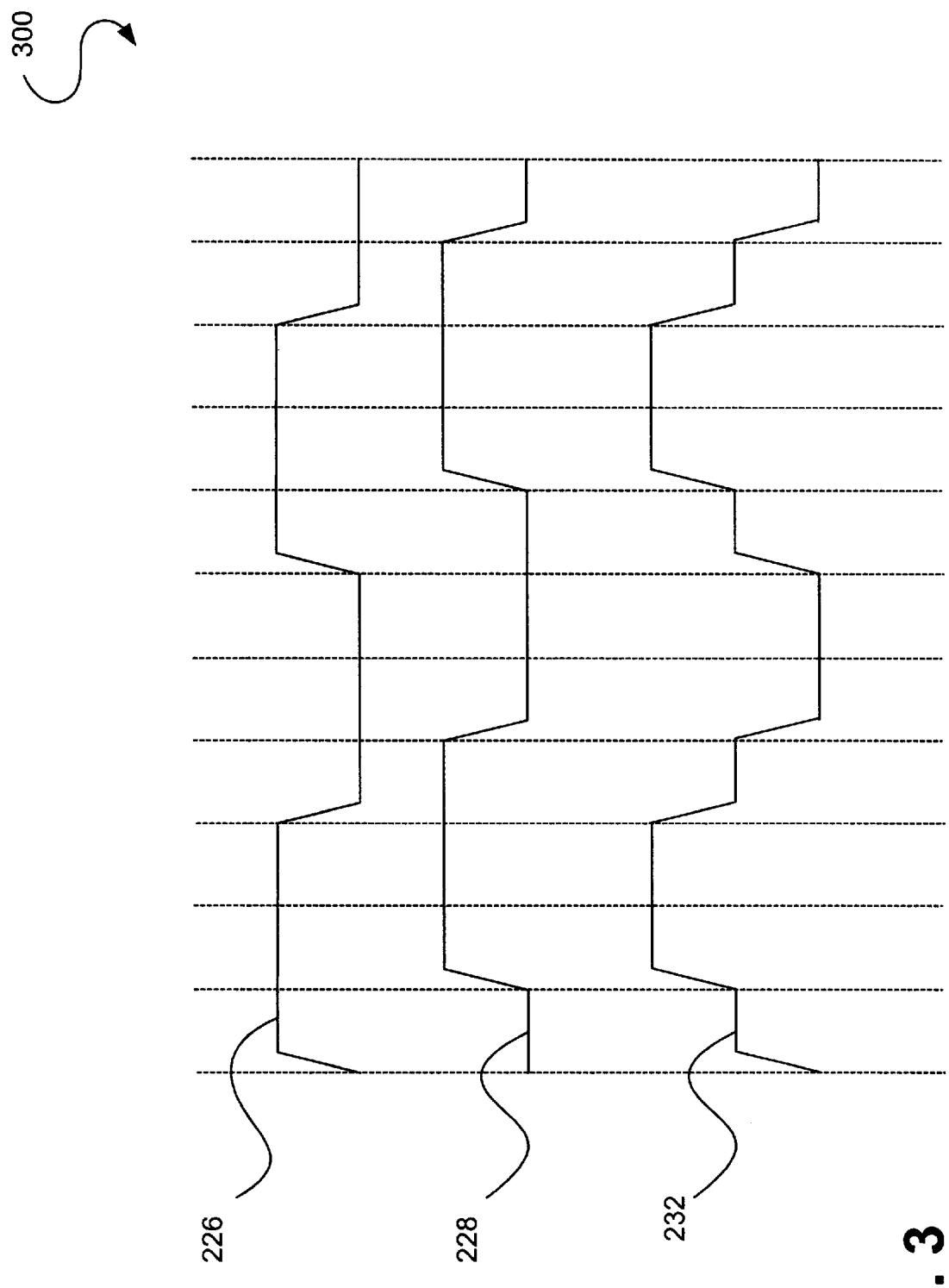
FIG. 3 is a timing diagram illustrating the combining of signals in the low harmonics mixing system shown in FIG. 2 to produce a low harmonics mixing system output.

FIG. 2 is a block diagram illustrating an embodiment of a low harmonics mixing system 200 of this invention. Low harmonics mixing system 200 may be used in demodulator 198, modulator 144, up-converter 150, and/or downconverter 186 in place of conventional mixer(s) in order to reduce or eliminate third-order mixing products that may otherwise cause signal distortions. In this embodiment, low harmonics mixing system 200 comprises a phase-shifting component ("PSC") 202, a first mixer 204, and a second mixer 206. Each of the mixers 204 and 206 may be a mixer of any type, active or passive. Examples of mixers that can be used include, but are not limited to, a single diode mixer, a double diode mixer, a single-balanced two-diode mixer, a single-ended junction field effect transistor (JFET) mixer, a dual-gate metal oxide semiconductor field effect transistor (MOSFET) mixer, a gilbert cell mixer, and a double-balanced gilbert cell mixer, etc. Input signal 208 is divided at node 210 into signals 212 and 214 that are forwarded to mixers 204 and 206 respectively. An LO signal 218 is divided by the PSC 202 into signals 220 and 222 having a 60° phase difference. The phase-shifting component 202 may comprise, for example, a polyphase filter, a frequency divider, a delay-locked loop, or any other phase-shifting circuit that is known in the art. Mixer 204 mixes signals 212 and 220 to produce signal 226 and mixer 206 mixes signals 214 and 222 to produce signal 228. Signals 226 and 228 are combined at combining element 230 to produce an output signal 232. Combining element 230 may be, for example, a combiner, an adder, or merely a node that sums currents.

If signal 212=signal 214=$A^*\cos(f_{in}{}^*t)$, signal 220=$B^*\cos(f_{lo}{}^*t+\phi)$, and signal 222=$B^*\cos(f_{lo}{}^*t+\phi+60°)$, then the third-order terms of signals 226 and 228 would cancel each other out after being combined to produce low harmonics mixing system output 232 as demonstrated by the following equation:

Third-order terms of the low harmonics mixing system output=$A^*\cos(f_{in}{}^*t)^*B/3^*\cos($ $3f_{lo}{}^*t+3\phi)+A^*\cos(f_{in}{}^*t)^*B/3^*\cos($ $3f_{lo}{}^*t+3\phi+180)=A^*B/3[\cos(($ $f_{in}+3f_{lo})t+3\phi)+\cos(($ $f_{in}+3f_{lo})t+3\phi+180)+\cos(($ $f_{in}-3f_{lo})t-3\phi)+\cos(($ $f_{in}-3f_{lo})t+3\phi-180)]=A^*B/3[\cos(($ $f_{in}+3f_{lo})t+3\phi)-\cos(($ $f_{in}+3f_{lo})t+3\phi)+\cos(($ $f_{in}-3f_{lo})t-3\phi)-\cos(($ $f_{in}-3f_{lo})t+3\phi)]=0$ In other embodiments, the phase difference between signals 220 and 222 is not equal to 60°. A phase difference between signals 220 and 222 of any magnitude other than 120° or 240° may result in some reduction of third-order mixing products in the output 230. However, deviations from the recommended phase shift of 60° may result in a lesser reduction of third-order mixing products in the output 230. For example, a 10° deviation from the recommended phase shift of 60° may result in only a 50% reduction in third order mixing products.

With additional reference to FIG. 2 throughout the descriptions of FIGS. 3–6, FIG. 3 is timing diagram 300 illustrating the addition of signals 226 and 228 to produce output signal 232. In this example, signal 226 lags signal 228 by 60°. As shown in timing diagram 300, system output signal 232 is a step-shaped signal that has the same frequency as signals 226 and 228. Since signal 228 lags signal 226 by 60°, each of the odd harmonics of signal 228 will lag a corresponding odd harmonic of signal 226 by "n" times 60°, where "n" is the harmonic number. For example, the third harmonic of signal 228 will lag the third harmonic of signal 226 by 180°. Therefore, by adding signals 226 and 228, the resulting system output 232 may have substantially zero third-order mixing products.

FIGS. 4 and 5 are phase diagrams 400 & 500, respectively illustrating examples of third harmonics cancellation by low harmonics mixing system 200. Phase diagram 400 & 500 include a "real" axis 402 and an "imaginary" axis 404. Third harmonic components 406 and 408 are contained in signals 226 and 228, respectively (FIG. 2). Components 406 and 408 have the same magnitude but are 180° opposite in phase. Therefore, by combining signals 226 and 228, third harmonics components 406 and 408, respectively, can effectively cancel each other.

The phase of a harmonic component depends on the manner in which the PSC 202 divides the LO signal 218. For example, if signals 220 and 222 have respective phase angles of –30° and +30°, then the third harmonic components 406 and 408 would have phase angles of –90° and +90° respectively, as shown in FIG. 4. However, if signals 220 and 222 have respective phase angles of 0° and +60°, then the third harmonic components 506 and 508 contained in signals 226 and 228 respectively would have phase angles of 0° and +180° respectively, as shown in FIG. 5. Components 506 and 508 have the same magnitude but have a 180° phase difference. Therefore, regardless of how the 60° phase difference between signals 220 and 222 is achieved, the third-order mixing products in signals 226 and 228 can be significantly reduced or eliminated by combining signals 226 and 228.

It is also often desirable to have a mixer that is free of more than one harmonic mixing product. In such cases, extra mixers and phase-splits may be needed. Specifically, for each harmonic to be suppressed, a phase split equal to 180 degrees divided by the harmonic number may be used.

Figure 6:
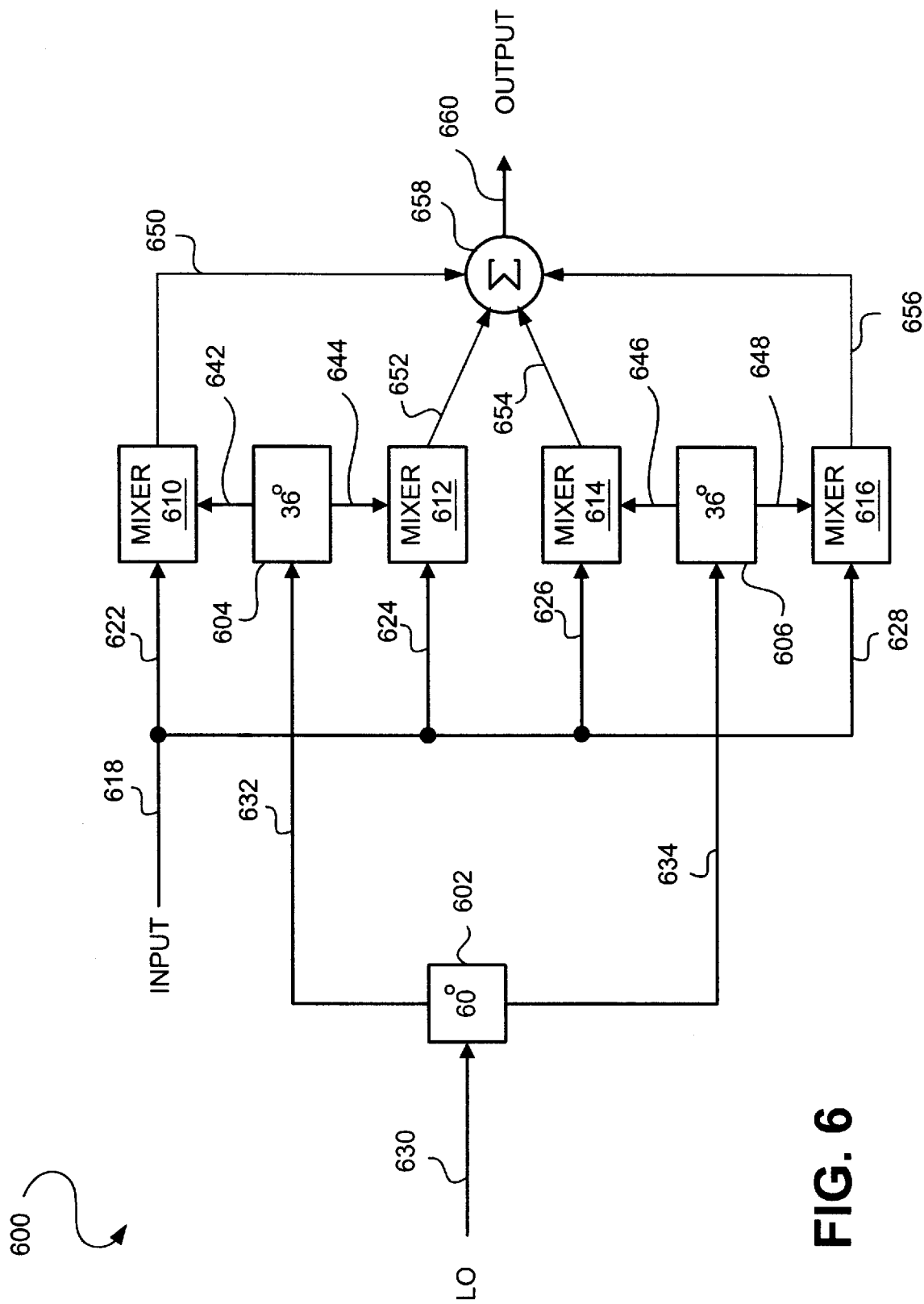
FIG. 6 is a block diagram illustrating an embodiment of a low harmonics mixing system for suppressing third-order and fifth-order mixing products.

FIG. 6 is a block diagram illustrating an embodiment of a low harmonics mixing system 600 for suppressing $3^{rd}$ and $5^{th}$ order harmonics of the LO signal. Low harmonics mixing system 600 may be used in demodulator 198, modulator 144, up-converter 150, and/or down-converter 186 in place of conventional mixer(s) in order to help reduce or eliminate third-order and fifth-order mixing products that may otherwise cause signal distortions. In this embodiment, low harmonics mixing system 600 includes three PSCs 602, 604, and 606 as well as four mixers 610, 612, 614, and 616. Each of the mixers 610, 612, 614, and 616 may be a mixer of any type, active or passive as mentioned above with respect to FIG. 2.

An input signal 618 is divided into substantially identical signals 622, 624, 626, and 628 that are received by mixers 610, 612, 614, and 616, respectively. An LO signal 630 is divided by PSC 602 into signals 632 and 634 having a 60° phase difference. Signal 632 is further divided by PSC 604 into signals 642 and 644 having a 36° phase difference, and signal 634 is further divided by PSC 606 into signals 646 and 648 also having a 36° phase difference. Phase-shifting components 602, 604, and 606 may each comprise, for example, a polyphase filter, a frequency divider, a delay-locked loop, or any other phase-shifting circuit that is known in the art. The four mixers 610, 612, 614, and 616 receive signals 642, 644, 646, and 648, respectively, and signals 622, 624, 626, and 628, respectively, and produce mixer output signals 650, 652, 654, and 656, respectively. The mixer output signals 650, 652, 654, and 656 are combined in combining element 658 to produce an output signal 660. Combining element 658 may be, for example, a combiner, an adder, or merely a node that sums currents.

The output signal 660 has substantially no third, fifth, or ninth order mixing products. For example, for signal 618= $A*\cos(f_{in}*t)$, signal 632=$B*\cos(f_{lo}*t+\phi)$, and signal 634= $B*\cos(f_{lo}*t+\phi+60°)$, the magnitude of various harmonics are derived below, normalized to a single mixer:

Fundamental: $B/2*\cos(60/2-36/2)+B/2*\cos(60/2+36/2) = B/2*\cos(12)+B/2*\cos(48)=B*0.82$ $3^{rd}$ order harmnonic: $B/2*\cos(3*60/2-3*36/2)+B/2*\cos(3*60/2+3*36/2) = B/6*\cos(36)+B/6*\cos(144)=0$ $5^{th}$ order harmonic: $B/10*\cos(5*60/2-5*36/2)+B/10*\cos(5*60/2+5*36/2)=B/10*\cos(60)+B/10*\cos(240)=0$ $7^{th}$ order harmonic: $B/14*\cos(7*60/2-7*36/2)+B/14*\cos(7*60/2+7*36/2) = B/10*\cos(84)+B/10*\cos(336)=B*0.07$ $9^{th}$ order harmonic: $B/18*\cos(9*60/2-9*36/2)+B/18*\cos(9*60/2+9*36/2) = B/18*\cos(108)+B/18*\cos(432)=0$ In other embodiments, the phase differences between signals 642 and 644 and between signals 646 and 648 are not equal to 36° and the phase difference between signals 632 and 634 is not equal to 60°. However, deviations from the recommended phase shifts may result in a lesser reduction of odd-order mixing products in output 660. With additional reference to FIG. 6, FIGS. 7 and 8 are phase diagrams 700 & 800, respectively, illustrating examples of the cancellation of third and fifth order harmonics, respectively, by low harmonics mixing system 600. Phase diagrams 700 & 800 each include a "real" axis 702 and an "imaginary" axis 704. Third harmonic components 706, 708, 710, and 712 are contained in signals 650, 652, 654, and 656, respectively. Component 706 has a 180° phase difference with component 710, and component 708 has a 180° phase difference with component 712. Similarly, fifth order harmonic components 806, 808, 810, and 812 are contained in signals 650, 652, 654, and 656, respectively. Component 806 has a 180° phase difference with component 808, and component 810 has a 180° phase difference with component 812. Therefore, by combining signals 650, 652, 654, and 656, the third and fifth order mixing products produced as a result of the third and fifth order harmonic components, can be effectively eliminated.

Phase diagrams 700 & 800 are based on an implementation in which each of the phase-shifting components 602, 604, and 606 produces signals that are phase-shifted in equal but opposite directions relative to the respective phase-shifting component's input signal. For example, signals 632 and 634 are phase-shifted +30° and −30°, respectively, relative to LO signal 630. As a result, the phases of signals 642, 644, 646, and 648 may be, for example, 48°, 12°, −12°, and −48°, respectively. Note, however, that in other embodiments phase-shifting components 602, 604, and 606 do not necessarily shift signals in equal and/or opposite directions. Therefore, in an alternative embodiment, each of the phase-shifting components 602, 604, and 606 may produce only one signal that is phase-shifted relative to the respective phase-shifting component's input signal. For example, signals 632 may be phase-shifted by +60° relative to LO signal 630, while signal 634 may be in-phase with the LO signal 630.

Figure 9:
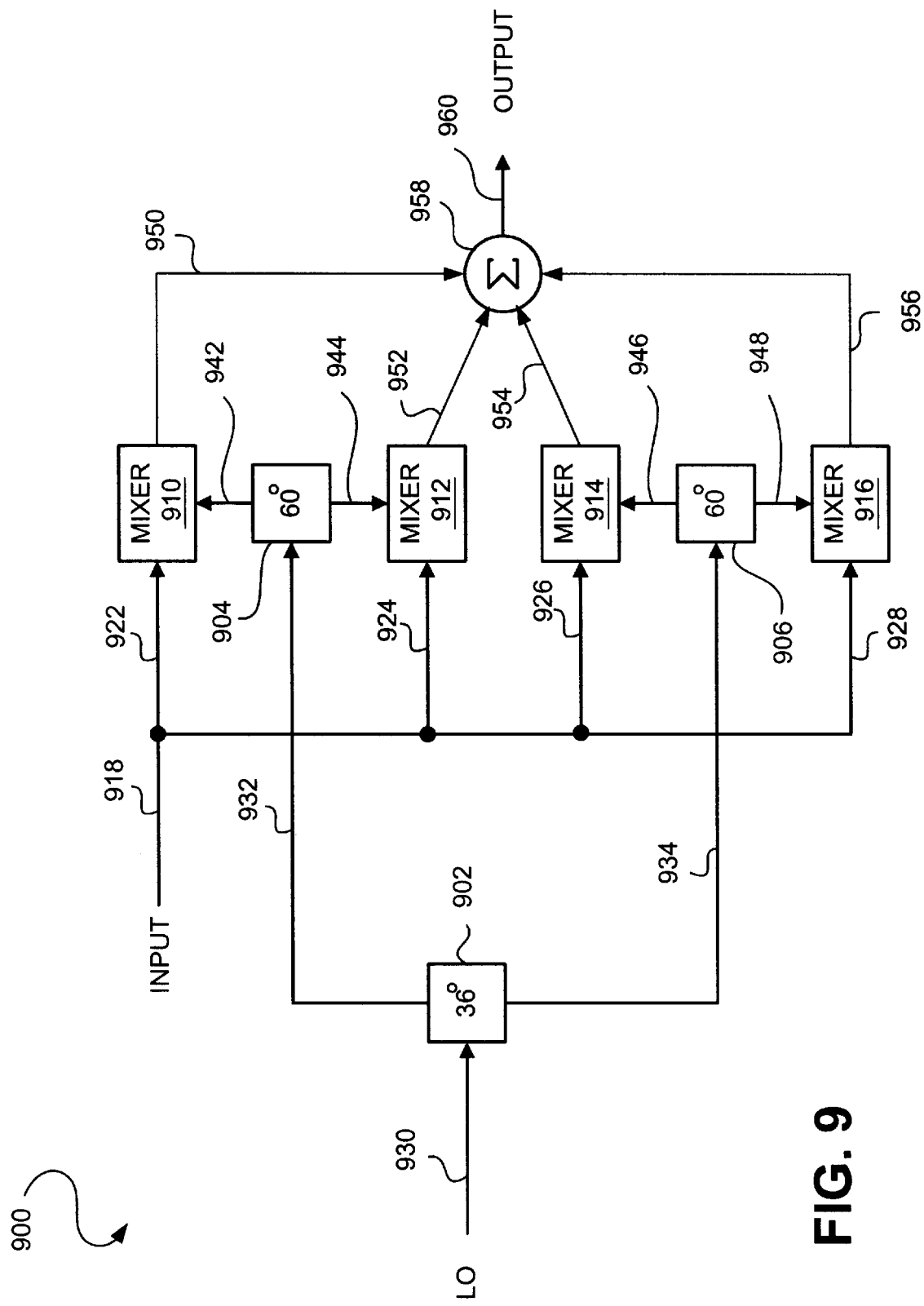
FIG. 9 is a block diagram illustrating an alternative embodiment of a low harmonics mixing system for suppressing third-order and fifth-order mixing products.

FIG. 9 is a block diagram illustrating an alternative embodiment of a low harmonics mixing system 900 for suppressing $3^{rd}$ and $5^{th}$ order mixing products. Low harmonics mixing system 900 may be used in demodulator 198, modulator 144, up-converter 150, and/or down-converter 186 in place of conventional mixer(s) in order to help reduce or eliminate third-order and fifth-order mixing products that may otherwise cause signal distortions. In this embodiment, low harmonics mixing system 900 includes three PSCs 902, 904, and 906 as well as four mixers 910, 912, 914, and 916. Each of the mixers 910, 912, 914, and 916 may be a mixer of any type, active or passive as mentioned above with respect to FIG. 2.

An input signal 918 is divided into substantially identical signals 922, 924, 926, and 928 that are received by mixers 910, 912, 914, and 916, respectively. An LO signal 930 is divided by PSC 902 into signals 932 and 934 having a 36° phase difference. Signal 932 is further divided by PSC 904 into signals 942 and 944 having a 60° phase difference, and signal 934 is further divided by PSC 906 into signals 946 and 948 also having a 60° phase difference. Phase-shifting components 902, 904, and 906 may each comprise, for example, a polyphase filter, a frequency divider, a delay-locked loop, or any other phase-shifting circuit that is known in the art. The four mixers 910, 912, 914, and 916 receive signals 942, 944, 946, and 948, respectively, and signals 922, 924, 926, and 928, respectively, and produce mixer output signals 950, 952, 954, and 956, respectively. The mixer output signals 950, 952, 954, and 956 are combined in combining element 958 to produce an output signal 960. Combining element 958 may be, for example, a combiner, an adder, or merely a node that sums currents. The output signal 960 has substantially no third, fifth, or ninth order mixing products.

In other embodiments, the phase differences between signals 942 and 944 and 20 between signals 946 and 948 are not equal to 60° and the phase difference between signals 942 and 944 is not equal to 36°. However, deviations from the recommended phase shifts may result in a lesser reduction of odd-order mixing products in output 960.

Figure 10:
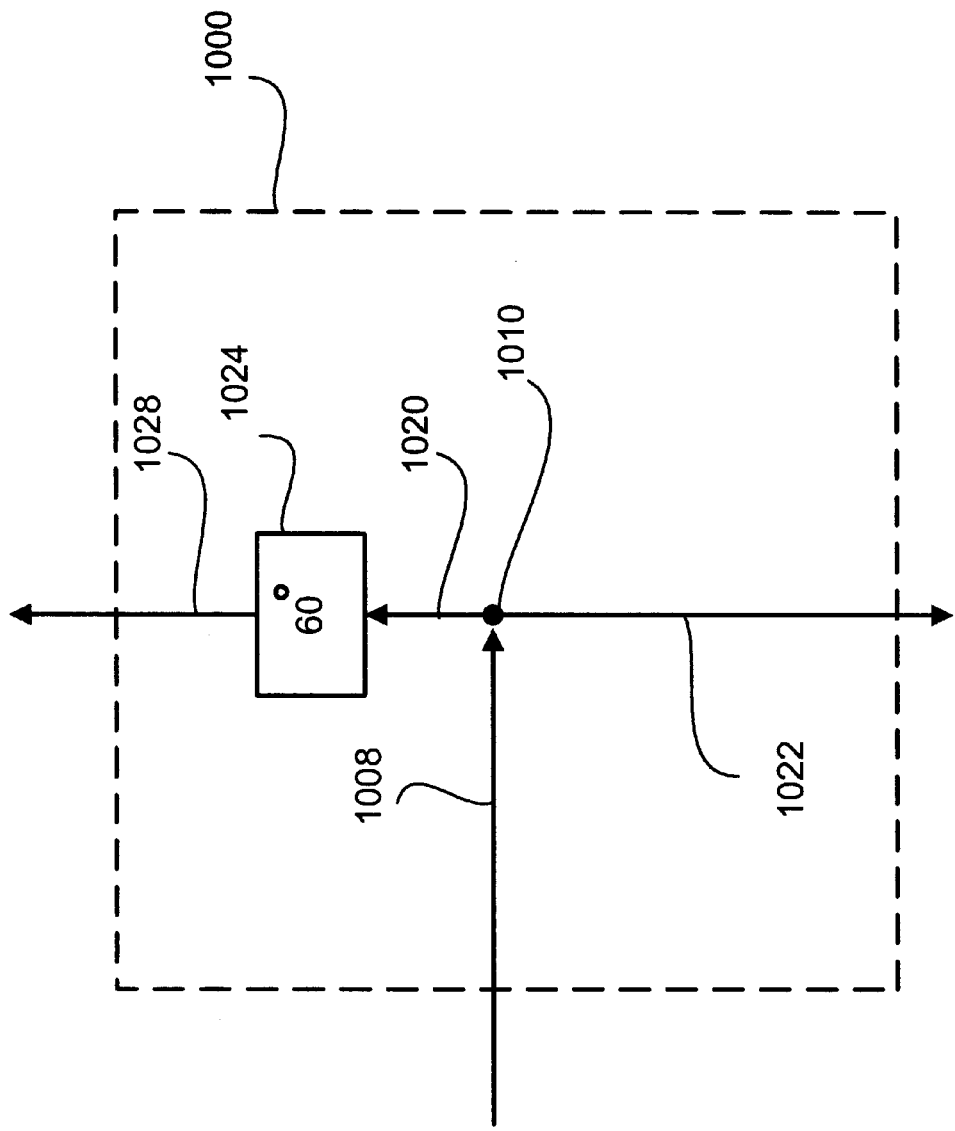
FIG. 10 is a block diagram illustrating one possible configuration of 60° phase-shifting components shown in FIGS. 2, 6, and 9.

FIG. 10 is a block diagram illustrating one possible configuration 1000 of a 60° PSC such as, for example, PSC 202 (FIG. 2), PSC 602 (FIG. 6), PSC 904 and PSC 906 (FIG. 9). LO signal 1008 is divided at node 1010 into signals 1020 and 1022. Phase shifting element 1024 shifts the phase of signal 1020 by angle equal to 60° to produce signal 1028. As a result signals 1028 and 1022 would have a phase difference of 60°. A similar configuration can be used for a 36° PSC such as, for example, PSC 604 (FIG. 6), PSC 606 (FIG. 6), and PSC 902 (FIG. 9), except that phase shifting element 1024 would shift the phase of signal 1020 by an angle substantially equal to 36° to produce signal 1028.

Figure 11:
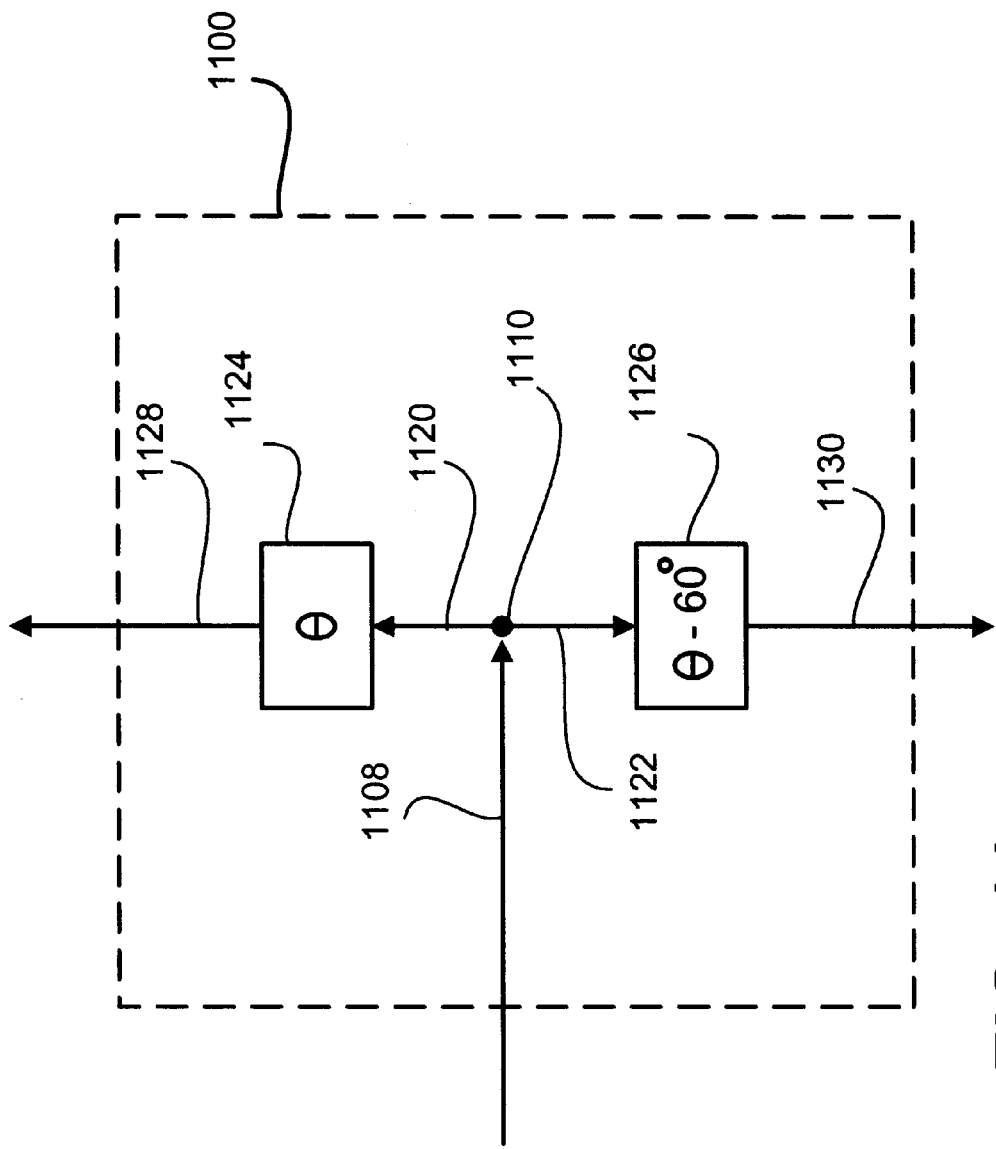
FIG. 11 is a block diagram illustrating another possible configuration of 60° phase-shifting components shown in FIGS. 2, 6, and 9.

FIG. 11 is a block diagram illustrating another possible configuration 1100 of a 60° PSC. LO signal 1108 is divided at node 1110 into signals 1120 and 1122 that are received by phase shifting elements 1124 and 1126 respectively. Phase shifting element 1124 shifts the phase of signal 1120 by angle equal to θ to produce signal 1128 whereas phase shifting element 1126 shifts the phase of signal 1122 by an angle substantially equal to θ plus or minus 60° to produce signal 1130. As a result, signals 1128 and 1130 have a phase difference of 60°. A similar configuration can be used for a 36° PSC such as, for example, PSC 604 (FIG. 6), PSC 606 (FIG. 6), and PSC 902 (FIG. 9), except that phase shifting element 1126 would shift the phase of signal 1122 by an angle substantially equal to θ plus or minus 36° to produce signal 1130.

While various embodiments of the invention have been described, it will be apparent to those of ordinary skill in the art that many more embodiments and implementations are possible that are within the scope of this invention.

What is claimed is:

1. A signal processing system comprising:
    a plurality of mixers, each configured to receive a local oscillator signal and an input signal, and configured to provide a mixer output;
    where a phase of a first local oscillator signal provided to a first mixer is different from a phase of a second local oscillator signal provided to a second mixer;
    where the plurality of mixer outputs are combined; and
    where a phase difference between the first local oscillator signal and the second local oscillator signal is predetermined to cause the first mixer to produce a third-order mixing product that substantially cancels out a third-order mixing product that is produced by the second mixer.

2. The signal processing system of claim 1, where the phase difference between the first local oscillator signal and the second local oscillator signal is between 55° and 65°.

3. The signal processing system of claim 1, where the phase difference between the first local oscillator signal and the second local oscillator signal is between 45° and 75°.

4. The signal processing system of claim 1, where the phase difference between the first local oscillator signal and the second local oscillator signal is between 35° and 85°.

5. The signal processing system of claim 1, where the phase difference between the first local oscillator signal and the second local oscillator signal is between 26° and 46°.

6. The signal processing system of claim 1, where the phase difference between the first local oscillator signal and the second local oscillator signal is between 16° and 56°.

7. The signal processing system of claim 1, where the phase difference between the first local oscillator signal and the second local oscillator signal is substantially 60°.

8. The signal processing system of claim 1, further comprising a phase shifting circuit for shifting a phase of a local oscillator signal.

9. The signal processing system of claim 8, where the signal processing system is a downconverter.

10. The signal processing system of claim 8, where the signal processing system is an upconverter.

11. The signal processing system of claim 8, where the signal processing system is a modulator.

12. The signal processing system of claim 8, where the signal processing system is a demodulator.

13. The signal processing system of claim 8, where the signal processing system is a mobile telephone.

14. The signal processing system of claim 1, where the phase difference is substantially 36°.

15. The signal processing system of claim 14, where the first mixer produces a fifth-order mixing product that substantially cancels out a fifth-order mixing product that is produced by the second mixer.

16. The signal processing system of claim 14, further comprising a phase shifting circuit for shifting a phase of a local oscillator signal.

17. A method for processing signals comprising:
    receiving a plurality of local oscillator signals and a plurality of input signals at a plurality of mixers, where each of the plurality of mixers receives at least one local oscillator signal and at least one input signal;
    generating a plurality of mixer outputs, where each of the plurality of mixers generates at least one mixer output;
    combining the plurality of mixer outputs;
    where a phase of a first local oscillator signal provided to a first mixer is different from a phase of a second local oscillator signal provided to a second mixer; and
    where a phase difference between the first local oscillator signal and the second local oscillator signal is predetermined to cause the first mixer to produce a third-order mixing product that substantially cancels out a third-order mixing product that is produced by the second mixer.

18. The method of claim 17, where the phase difference between the first local oscillator signal and the second local oscillator signal is between 55° and 65°.

19. The method, of claim 17, where the phase difference between the first local oscillator signal and the second local oscillator signal is between 45° and 75°.

20. The method of claim 17, where the phase difference between the first local oscillator signal and the second local oscillator signal is between 35° and 85°.

21. The method of claim 17, where the phase difference between the first local oscillator signal and the second local oscillator signal is between 26° and 46°.

22. The method of claim 17, where the phase difference between the first local oscillator signal and the second local oscillator signal is between 16° and 56°.

23. The method of claim 17, where the phase difference between the first local oscillator signal and the second local oscillator signal is substantially 60°.

24. The method of claim 23, where the method is implemented in an upconverter.

25. The method of claim 23, where the method is implemented in a downconverter.

26. The method of claim 23, where the method is implemented in a demodulator.

27. The method of claim 23, where the method is implemented in a modulator.

28. The method of claim 23, where the method is implemented in a mobile telephone.

29. The method of claim 17, where the phase difference between the first local oscillator signal and the second local oscillator signal is substantially 36°.

30. The method of claim 29, where the first mixer produces a fifth-order mixing product that substantially cancels out a fifth-order mixing product that is produced by the second mixer.

31. A signal processing system comprising:
    a first mixer for receiving a first local oscillator signal and a first input signal, and for generating a first mixer output;
    a second mixer for receiving a second local oscillator signal and a second input signal and for generating a second mixer output;
    where a phase of the first local oscillator signal and a phase of the second local oscillator signal differ by substantially 60°; and
    where the first mixer output and the second mixer output are combined.

32. The signal processing system of claim 31, where a first signal component contained in the first mixer output and a second signal component contained in the second mixer output have substantially equal magnitudes and a phase difference substantially equal to 180°.

33. The signal processing system of claim 32, where the first signal component and the second signal component are third-order mixing products that substantially cancel each other after the first mixer output is combined with the second mixer output.

34. The signal processing system of claim 33, where the first input signal and the second input signal are substantially identical and are derived from a common source.

35. The signal processing system of claim 34, where the first local oscillator signal and the second local oscillator signal are derived from a common source.

36. The signal processing system of claim 31, where the signal processing system is an upconverter.

37. The signal processing system of claim 31, where the signal processing system is a downconverter.

38. The signal processing system of claim 31, where the signal processing system is a modulator.

39. The signal processing system of claim 31, where the signal processing system is a demodulator.

40. The signal processing system of claim 31, where the signal processing system is a mobile telephone.

41. A signal processing system comprising:
a first mixer for receiving a first local oscillator signal and a first input signal, and for generating a first mixer output;
a second mixer for receiving a second local oscillator signal and a second input signal and for generating a second mixer output;
where a phase of the first local oscillator signal and a phase of the second local oscillator signal differ by substantially 36°; and
where the first mixer output and the second mixer output are combined.

42. The signal processing system of claim 41, where an output from a third mixer and an output from a fourth mixer are combined with the first mixer output and the second mixer output.

43. The signal processing system of claim 42, where a third-order mixing product contained in the first mixer output substantially cancels out a third-order mixing product contained in the output from the third mixer.

44. The signal processing system of claim 43, where a third-order mixing product contained in the second mixer output substantially cancels out a third-order mixing product contained in the output from the fourth mixer.

45. The signal processing system of claim 41, further comprising a phase offsetting divider for providing a phase altered local oscillator signal.

46. The signal processing system of claim 41, where the signal processing system is an upconverter.

47. The signal processing system of claim 41, where the signal processing system is a downconverter.

48. The signal processing system of claim 41, where the signal processing system is a modulator.

49. The signal processing system of claim 41, where the signal processing system is a demodulator.

50. The signal processing system of claim 41, where the signal processing system is a mobile telephone.

51. A signal processing system comprising:
a first mixer for receiving a first local oscillator signal and a first input signal, and for generating a first mixer output;
a second mixer for receiving a second local oscillator signal and a second input signal and for generating a second mixer output;
a third mixer for receiving a third local oscillator signal and a third input signal, and for generating a third mixer output;
a fourth mixer for receiving a fourth local oscillator signal and a fourth input signal and for generating a fourth mixer output;
where a phase of the first local oscillator signal and a phase of the second local oscillator signal have a phase difference;
where a phase of the third local oscillator signal and a phase of the fourth local oscillator signal have a phase difference; and
where the first mixer output, the second mixer output, the third mixer output, and the fourth mixer output are combined.

52. The signal processing system of claim 51, where a phase of the first local oscillator signal and a phase of the second local oscillator signal differ by substantially 36°.

53. The signal processing system of claim 52, where a phase of the third local oscillator signal and a phase of the fourth local oscillator signal differ by substantially 36°.

54. The signal processing system of claim 53, where a signal that is used to derive the first local oscillator signal and the second local oscillator signal has a phase that differs by substantially 60° from the a signal that is used to derive the third local oscillator signal and the fourth local oscillator signal.

55. The signal processing system of claim 54, where the average phase for the first and second local oscillator signals differs by substantially 60° from the average phase for the third and fourth local oscillator signals.

56. The signal processing system of claim 55, where the first mixer output, the second mixer output, the third mixer output, and the fourth mixer output, each have a third-order mixing product.

57. The signal processing system of claim 56, where the third harmonic components of the first mixer, the second mixer, the third mixer, and the fourth mixer have a sum that is substantially equal to zero.

58. The signal processing system of claim 57, where the first mixer output, the second mixer output, the third mixer output, and the fourth mixer output, each have a fifth harmonic component.

59. The signal processing system of claim 51, where the fifth harmonic components of the first mixer, the second mixer, the third mixer, and the fourth mixer have a sum that is substantially equal to zero.

60. The signal processing system of claim 51, further comprising a phase offsetting divider for providing a phase altered local oscillator signal.

61. The signal processing system of claim 51, where the signal processing system is an upconverter.

62. The signal processing system of claim 51, where the signal processing system is a downconverter.

63. The signal processing system of claim 51, where the signal processing system is a modulator.

64. The signal processing system of claim 51, where the signal processing system is a demodulator.

65. The signal processing system of claim 51, where the signal processing system is a mobile telephone.

66. A method for mixing signals comprising:
receiving a first local oscillator signal and a first input signal at a first mixer;
generating a first mixer output at the first mixer;
receiving a second local oscillator signal and a second input signal at a second mixer;
generating a second mixer output at the second mixer;
combining the first mixer output and the second mixer output; and
where a phase of the first local oscillator signal and a phase of the second local oscillator signal have a 60° phase difference.

67. The method of claim 66, where a first signal component contained in the first mixer output and a second signal component contained in the second mixer output have substantially equal magnitudes and a phase difference substantially equal to 180°.

68. The method of claim 67, where the first signal component and the second signal component are third-order mixing terms that substantially cancel each other after the first mixer output is combined with the second mixer output.

69. The method of claim 68, where the first input signal and the second input signal are substantially identical and are derived from a common source.

70. The method of claim 69, where the first local oscillator signal and the second local oscillator signal are derived from a common source.

71. A method for mixing signals comprising:
receiving a first local oscillator signal and a first input signal at a first mixer;
generating a first mixer output at the first mixer;
receiving a second local oscillator signal and a second input signal at a second mixer;
generating a second mixer output at the second mixer;
combining the first mixer output and the second mixer output; and
where a phase of the first local oscillator signal and a phase of the second local oscillator signal have a 36° phase difference.

72. The method of claim 71, further comprising:
combining an output from a third mixer and an output from a fourth mixer with the first mixer output and the second mixer output.

73. The method of claim 72, where a third-order mixing product contained in the first mixer output substantially cancels out a third-order mixing product contained in the third mixer output after the first mixer output and the third mixer output are combined.

74. The method of claim 73, where a third-order mixing product contained in the second mixer output substantially cancels out a third-order mixing product contained in the fourth mixer output after the second mixer output and the fourth mixer output are combined.

* * * * *